United States Patent
Roberts et al.

(10) Patent No.: US 11,145,936 B2
(45) Date of Patent: Oct. 12, 2021

(54) BATTERY INTERCONNECT ASSEMBLY AND METHOD

(71) Applicant: Ford Global Technologies, LLC, Dearborn, MI (US)

(72) Inventors: Daniel Paul Roberts, Livonia, MI (US); Francisco Fernandez-Galindo, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 106 days.

(21) Appl. No.: 16/211,566

(22) Filed: Dec. 6, 2018

(65) Prior Publication Data

US 2020/0185683 A1 Jun. 11, 2020

(51) Int. Cl.

| H01M 6/42 | (2006.01) |
| H01M 50/502 | (2021.01) |
| H01M 10/48 | (2006.01) |
| H05K 1/11 | (2006.01) |
| H05K 1/18 | (2006.01) |

(52) U.S. Cl.
CPC ....... *H01M 50/502* (2021.01); *H01M 10/482* (2013.01); *H05K 1/118* (2013.01); *H05K 1/189* (2013.01); *H01M 2220/20* (2013.01); *H05K 2201/05* (2013.01)

(58) Field of Classification Search
CPC ............... H01M 2/206; H01M 10/482; H01M 2220/20; H05K 1/118; H05K 1/189; H05K 2201/05
See application file for complete search history.

(56) References Cited

U.S. PATENT DOCUMENTS

| 5,397,239 | A | 3/1995 | Zaderej et al. |
| 6,288,386 | B1 * | 9/2001 | Bowen .................... G02B 23/12 250/214 VT |
| 8,747,159 | B2 * | 6/2014 | Liu ........................ G02B 6/4261 439/607.2 |
| 8,895,177 | B2 | 11/2014 | Marchio et al. |
| 9,553,343 | B2 | 1/2017 | Malcolm et al. |
| 9,692,031 | B2 | 6/2017 | Subramanian et al. |
| 10,020,476 | B2 * | 7/2018 | Fan ........................ H01M 2/206 |
| 2013/0207612 | A1 | 8/2013 | Lev et al. |
| 2015/0110155 | A1 * | 4/2015 | Turgeon ................. H01M 50/50 374/152 |
| 2016/0218401 | A1 * | 7/2016 | Hermann ............... H01M 50/20 |
| 2017/0077487 | A1 * | 3/2017 | Coakley ................ H01M 2/202 |

(Continued)

*Primary Examiner* — Raymond Alejandro
(74) *Attorney, Agent, or Firm* — David Kelley, Esq.; Carlson, Gaskey & Olds, P.C.

(57) ABSTRACT

A battery interconnect assembly includes, among other things, at least one first sense lead operably coupled to a structure on a first side of an array of battery cells, and at least one second sense lead operably coupled to a structure on a different, second side of the array. The assembly further includes a multi-port connector configured to communicate signals from both the at least one first sense lead and the at least one second sense lead. A battery monitoring method includes, among other things, communicating signals from a plurality of sense leads through a multi-port connector. At least one of the sense leads is operably connected to a first structure on a first side of a battery array, and least one of the sense leads is operably connected to a second structure on a different, second side of the battery array.

18 Claims, 6 Drawing Sheets

(56) References Cited

U.S. PATENT DOCUMENTS

| | | | |
|---|---|---|---|
| 2017/0229690 A1* | 8/2017 | Marpu | B60K 6/445 |
| 2018/0088179 A1* | 3/2018 | Ota | H01R 12/592 |
| 2019/0296407 A1* | 9/2019 | Newman | H01M 10/63 |
| 2020/0091494 A1* | 3/2020 | Fernandez-Galindo | H01M 10/482 |

* cited by examiner

BATTERY INTERCONNECT ASSEMBLY AND METHOD

TECHNICAL FIELD

This disclosure relates generally to an interconnect assembly for a traction battery array. The interconnect assembly includes a multi-port connector. Sense leads on different sides of the interconnect assembly extend to the multi-port connector.

BACKGROUND

Electrified vehicles differ from conventional motor vehicles because electrified vehicles are selectively driven using one or more electric machines powered by a traction battery. The electric machines can drive the electrified vehicles instead of, or in addition to, an internal combustion engine. Example electrified vehicles include hybrid electric vehicles (HEVs), plug-in hybrid electric vehicles (PHEVs), fuel cell vehicles (FCVs), and battery electric vehicles (BEVs).

The traction battery is a relatively high-voltage battery that selectively powers the electric machines and other electrical loads of the electrified vehicle. The traction battery can include modules. Each module includes battery cells that store energy. Sense leads can be used to monitor the battery cells. The sense leads facilitate voltage monitoring and cell balancing.

SUMMARY

A battery interconnect assembly according to an exemplary aspect of the present disclosure includes, among other things, at least one first sense lead operably coupled to a structure on a first side, and at least one second sense lead operably coupled to a structure on a different, second side. The assembly further includes a multi-port connector configured to communicate signals from both the at least one first sense lead and the at least one second sense lead.

In a further non-limiting embodiment of the foregoing assembly, the first side is transverse to the second side.

In a further non-limiting embodiment of any of the foregoing assemblies, the first side is opposite the second side.

In a further non-limiting embodiment of any of the foregoing assemblies, the multi-port connector is disposed on the first side, and the assembly further includes a sense lead crossover extending from the at least one second sense lead to the multi-port connector.

In a further non-limiting embodiment of any of the foregoing assemblies, the sense lead crossover is a flexible printed circuit.

In a further non-limiting embodiment of any of the foregoing assemblies, the structure on the first side is a busbar electrically coupled to at least one positive battery terminal, and the structure on the second side is a busbar electrically coupled to at least one negative battery terminal.

A further non-limiting embodiment of any of the foregoing assemblies includes a first and second flap each hinged to a base side. The structure on the first side is mounted to the first flap. The structure on the second side is mounted to the second flap.

In a further non-limiting embodiment of any of the foregoing assemblies, the first and second flap each include at least one snap feature configured to engage an endplate of a battery module.

In a further non-limiting embodiment of any of the foregoing assemblies, the base side provides a portion of an enclosure for battery cells.

A further non-limiting embodiment of any of the foregoing assemblies includes an enclosure cover. The structure on the first side is mounted to a first side of the enclosure cover. The structure on the second side is mounted to an opposite, second side of the enclosure cover.

A battery monitoring method according to another aspect of the present disclosure includes, among other things, communicating signals from a plurality of sense leads through a multi-port connector of an interconnect assembly. At least one of the sense leads is operably connected to a first structure on a first side of the interconnect assembly, and least one of the sense leads is operably connected to a second structure on a different, second side of the interconnect assembly.

In a further non-limiting embodiment of the foregoing method, the first side is transverse the second side.

In a further non-limiting embodiment of any of the foregoing methods, the first side is opposite the second side.

In a further non-limiting embodiment of any of the foregoing methods, the first structure is a first busbar electrically coupled to a positive terminal of a battery, and the second structure is a second busbar electrically coupled to a negative terminal of the battery.

In a further non-limiting embodiment of any of the foregoing methods, the plurality of the sense leads are secured to the interconnect assembly. The method further includes moving the interconnect assembly in a single direction relative to the battery to slide the positive terminal into a slot of the first busbar and the negative terminal into a slot of the second busbar.

In a further non-limiting embodiment of any of the foregoing methods, the plurality of the sense leads and the multi-port connector are portions of an interconnect assembly having a first and second side each pivotably connected to a base side. The method further includes pivoting the first side relative to the base side to insert the positive terminal into a slot of the first busbar, and pivoting the second side relative to the base side to insert the negative terminal into a slot of the second busbar.

A further non-limiting embodiment of any of the foregoing methods includes snap-fitting the first side and the second side to an endplate.

A further non-limiting embodiment of any of the foregoing methods includes securing the at least one sense lead using a thermoplastic staking process.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure relates generally to an interconnect assembly of a battery pack. The interconnect assembly includes a multi-port connector that provides an interface for communicating with sense leads on different sides of an array of battery cells. The interconnect assembly can, in some exemplary embodiments, further provide portions of a housing for the battery array.

In the past, different sides of the array would each include sense leads each communicating with a separate multi-port connector. Sense leads that extend from different sides of the array to the multi-port connector can simplify assembly over such designs.

Figure 1:
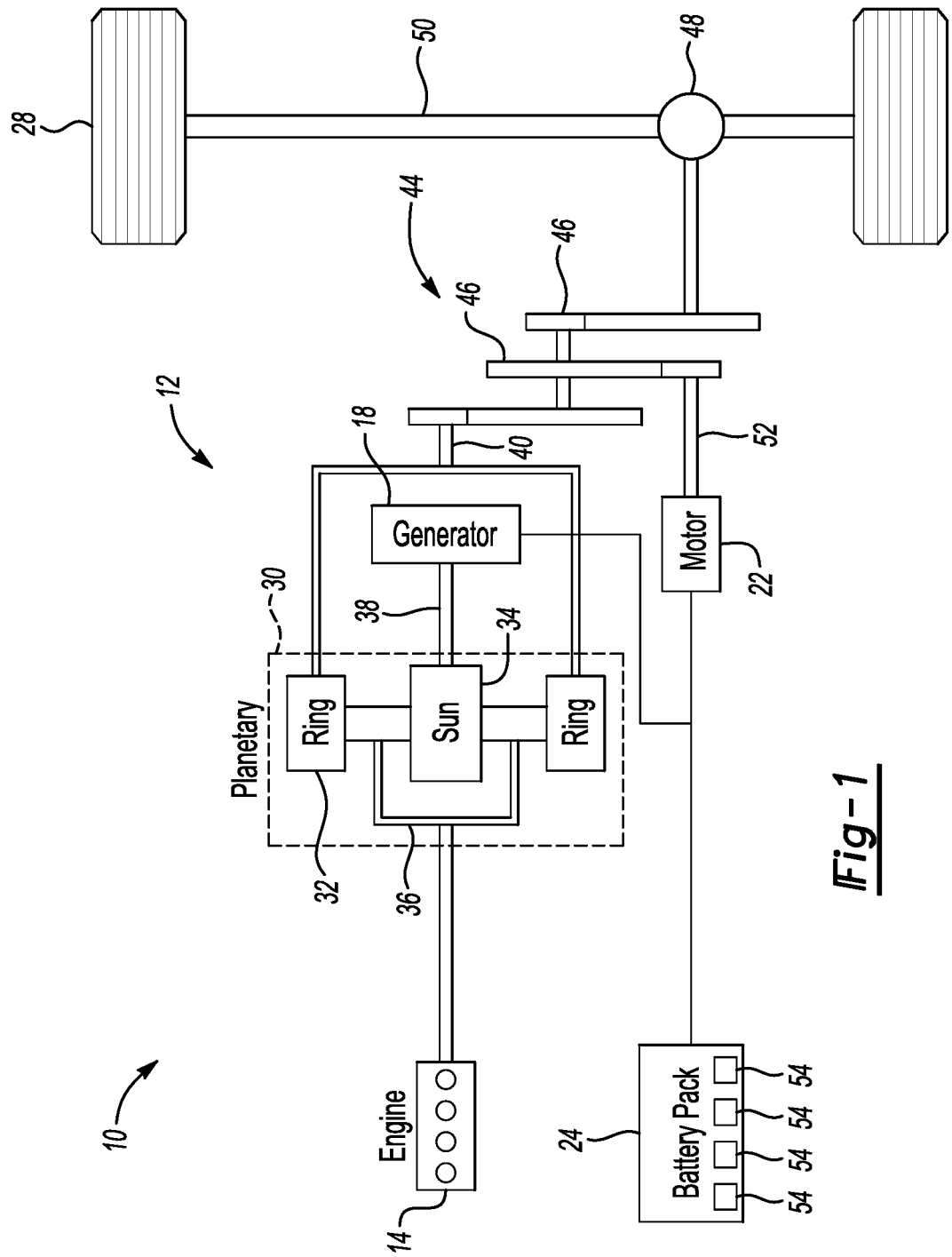
FIG. 1 illustrates a schematic view of a powertrain for an electrified vehicle.

FIG. 1 schematically illustrates a powertrain 10 for an electrified vehicle. Although depicted as a hybrid electrified vehicle (HEV), it should be understood that the concepts described herein are not limited to HEVs and could extend to other electrified vehicles, including, but not limited to, plug-in hybrid electrified vehicles (PHEVs), fuel cell vehicles, and battery electrified vehicles (BEVs).

In one embodiment, the powertrain 10 is a powersplit powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems generate torque to drive one or more sets of vehicle drive wheels 28 of the electrified vehicle.

The engine 14, which is an internal combustion engine in this example, and the generator 18 may be connected through a power transfer unit 30. In one non-limiting embodiment, the power transfer unit 30 is a planetary gear set that includes a ring gear 32, a sun gear 34, and a carrier assembly 36. Of course, other types of power transfer units, including other gear sets and transmissions, may be used to connect the engine 14 to the generator 18.

The generator 18 can be driven by engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In this example, the second power transfer unit 44 is mechanically coupled to an axle 50 through the differential 48 to distribute torque to the vehicle drive wheels 28.

The motor 22 (i.e., the second electric machine) can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery pack 24.

The battery pack 24 is an example type of electrified vehicle battery assembly. The battery pack 24 may have the form of a high-voltage battery that is capable of outputting electrical power to operate the motor 22 and the generator 18. Other types of energy storage devices and/or output devices can also be used with the electrified vehicle having the powertrain 10. The battery pack 24 is a traction battery pack as the battery pack 24 can provides power to propel the wheels 28. The battery pack 24 can include one or more modules 54.

Figure 2:
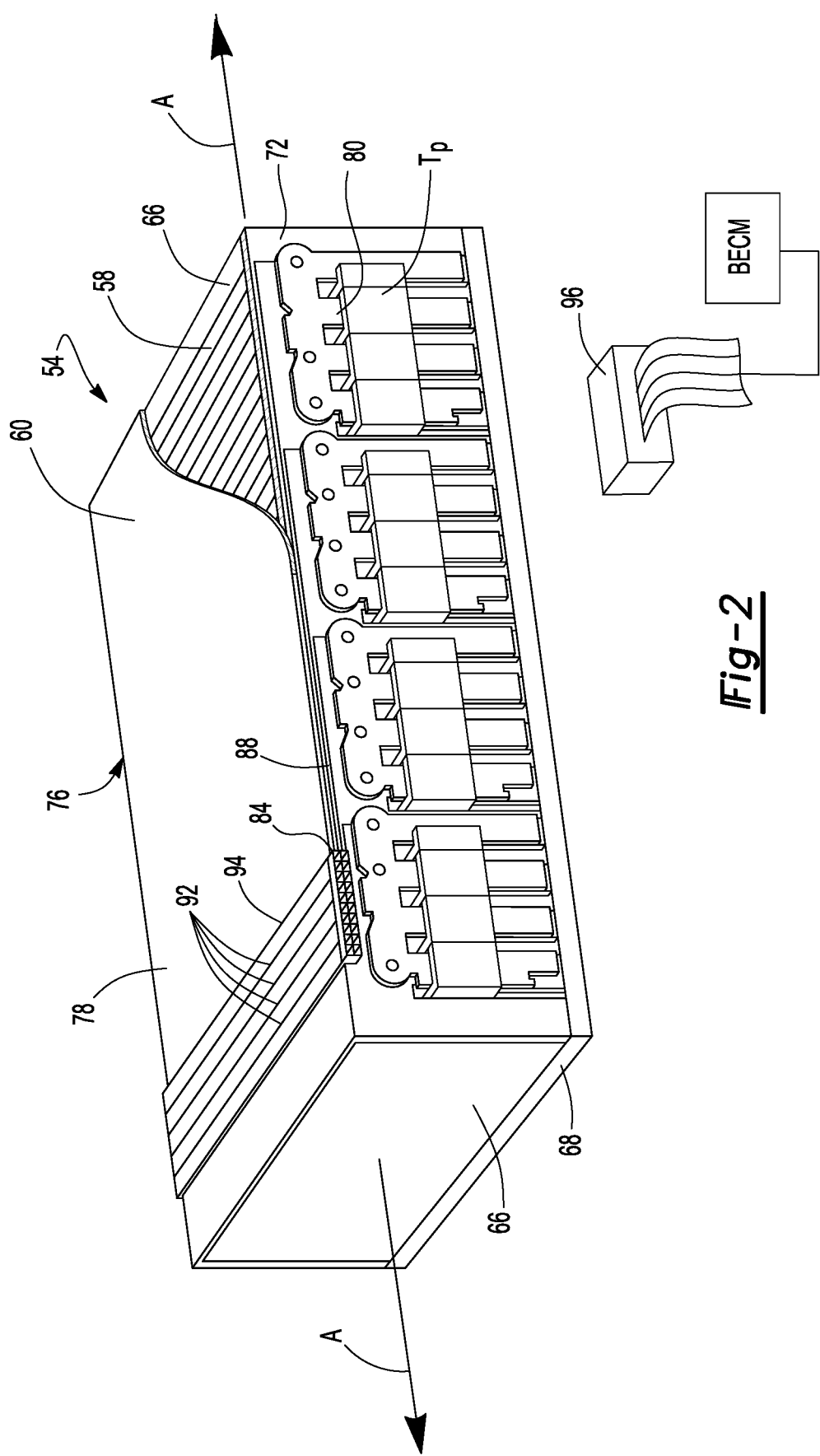
FIG. 2 illustrates an interconnect assembly utilized within a battery pack of the powertrain of FIG. 1.

Referring now to FIG. 2, each of the modules 54 includes a plurality of battery cells 58 disposed along an axis A. The modules 54 further include the interconnect assembly 60, endplates 66, and a tray structure 68.

The battery cells 58 are received within the interconnect assembly 60 and are sandwiched axially between endplates 66. The battery cells 58 are disposed on the tray structure 68. In this example, the interconnect assembly 60, the endplates 66, and the tray structure 68 substantially enclose the battery cells 58. The interconnect assembly 60 thus provides part of an enclosure structure—here an enclosure lid. The interconnect assembly 60 can be used in place of a separate enclosure lid thereby reducing overall part counts and complexity.

The interconnect assembly 60 includes a first side 72, a second side 76, and a base side 78. The first side 72 is opposite the second side 76. The first side 72 and the second side 76 extend from the base side 78. An axial cross-section of the interconnect assembly 60 has a "U" shaped profile. The first side 72, the second side 76, and the base side 78 can be made of a polymer-based material.

The interconnect assembly 60 further includes busbars 80, a multi-port connector 84, at least one sense lead 88, and at least one sense lead 92.

In this example, some of the busbars 80 are mounted to the first side 72 and electrically coupled to positive terminals $T_P$ extending from each of the battery cells 58. The second side 76 includes corresponding busbars electrically coupled to negative terminals of the battery cells 58.

The multi-port connector 84 is on the first side 72. The second side 76 does not include a multi-port connector.

The at least one first sense lead 88 operably connects one or more structures on the first side 72 to the multi-port connector 84. In this example, the structures on the first side 72 are the busbars 80 mounted to the first side 72. Thus, in the exemplary non-limiting embodiment, the at least one first sense lead 88 operably connects the busbars 80 mounted to the first side 72 to the multi-port connector 84.

The at least one second sense lead 92 operably connects one or more structures on the second side 76 to the multi-port connector 84. In this example, these structures on the second side 76 are the busbars mounted to the second side 76. Thus, in the exemplary non-limiting embodiment, the at least one second sense lead 92 operably connects the busbars mounted to the second side 76 to the multi-port connector 84.

To extend from the second side 76 to the multi-port connector 84, the at least one second sense lead 92 can be incorporated into a crossover 94 that extends from the second side 76 across the base side 78, to the first side 72. The crossover 94 could be a flexible printed circuit or a flat flexible cable. Other structures could be utilized to provide the crossover functionality in other examples. The crossover 94 can be mounted to a surface of the base side 78 that faces the battery cells 58, or mounted to an exterior surface of the base side 78 that faces away from the battery cells 58.

In some examples, a thermoplastic staking process is used to secure the at least one first sense lead 88, the at least one second sense lead 92, and the crossover 94 to the first side 72, the second side 76, and the base side 78. In one example, the thermoplastic staking process is a heat staking process. Other examples could secure the at least one first sense lead 88, the at least one second sense lead 92, and the crossover 94 in other ways. Thermoplastic staking could instead or additionally be used to hold the busbars 80 to the first side 72 and the second side 76.

The multi-port connector 84 is pin-type connector in this example. Each of the sense leads 88, 92 can be associated with one of the pins of the multi-port connector 84. The at least one first sense lead 88 and the at least one second sense lead 92 are, in this example, are provided by a relatively small gauge wire.

The multi-port connector 84 is configured to engage with another connector 96 when installed within a vehicle having the battery pack 24. Signals, such as voltage signals, can then communicate from the multi-port connector 84 of the interconnect assembly 60 to the connector 96, and to other areas of the vehicle. The signals can be voltages directly measured from one or more of the battery cells 58. Thermistor resistance could also be measured by the sense leads 88 and used to assess and monitor a temperature of the array of battery cells 58 or within portions of the array of battery cells 58.

In some example, the signals from the multi-port connector 84 may be communicated to a battery energy control module ("BECM") of the vehicle. The BECM can perform state of charge calculations, assess battery voltage levels, and execute other control functions based on the signals received through the multi-port connector 84. The BECM can use the signals from the sense leads 88, 92 to monitor battery cell voltage, battery cell current, and battery cell temperatures.

Notably, in the exemplary non-limiting embodiment, each module 54 of the battery pack 54 uses only the single multi-port connector 84 to communicate signals from sense leads on different sides of the module 54.

In the past, interconnect assemblies have included multiple different connectors that need to be engaged to operatively link a battery module to a BECM. For example, to operatively link to the BECM, past interconnect assemblies have required connecting to a connector on a first side, and have further required connecting to another connector on a second side. Multiple connectors can require increased packaging space and can complicate assembly.

Figure 3A:
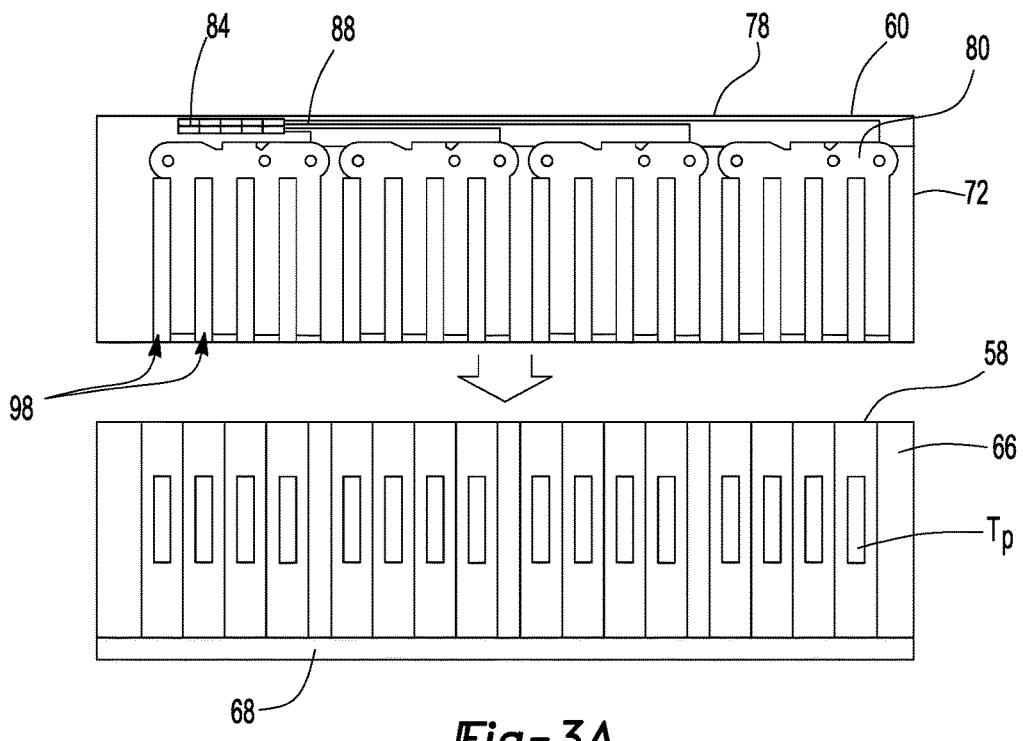
FIGS. 3A-3C illustrate side views at various stages of assembly when installing the interconnect assembly of FIG. 2 to a battery array.
Figure 4A:
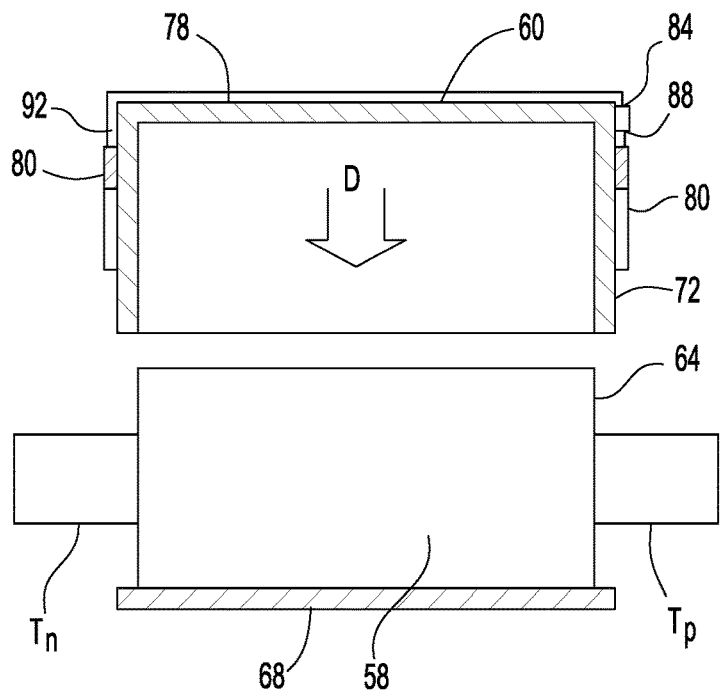
FIGS. 4A-4C illustrate schematic end views of the interconnect assembly and the battery array when at the stages of FIGS. 3A-3C.

Referring now to FIGS. 3A and 4A, assembling the interconnect assembly 60, according to an exemplary non-limiting embodiment includes moving the interconnect assembly 60 relative to the battery cells 58 in a direction D. During this movement, the positive terminals $T_P$ slide into respective slots 98 provided in the first side 72 and the busbars 80 mounted to the first side 72. Similarly, during this movement, the negative terminals $T_N$ slide into respective slots 98 provided in the second side 76 and the busbars 80 mounted to the second side 76. The positive terminals $T_P$ and the negative terminals $T_N$ extend laterally away from the battery cells 58 when the interconnect assembly 60 is moved in the direction D over the battery cells 58.

Figure 3B:
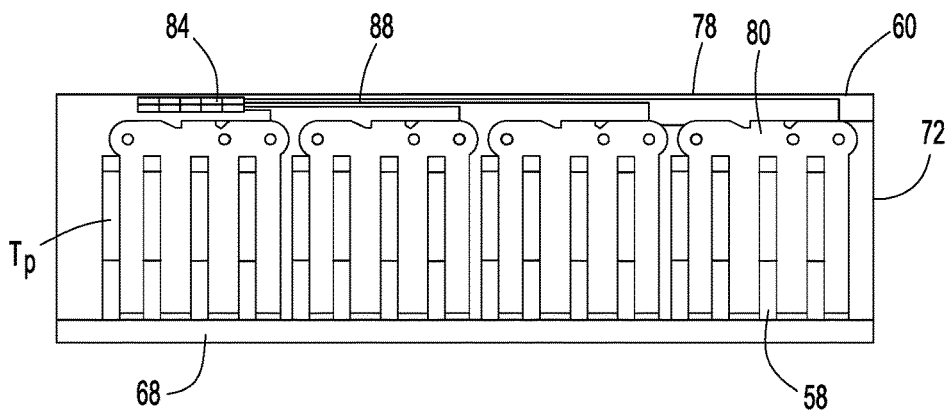
Figure 3C:
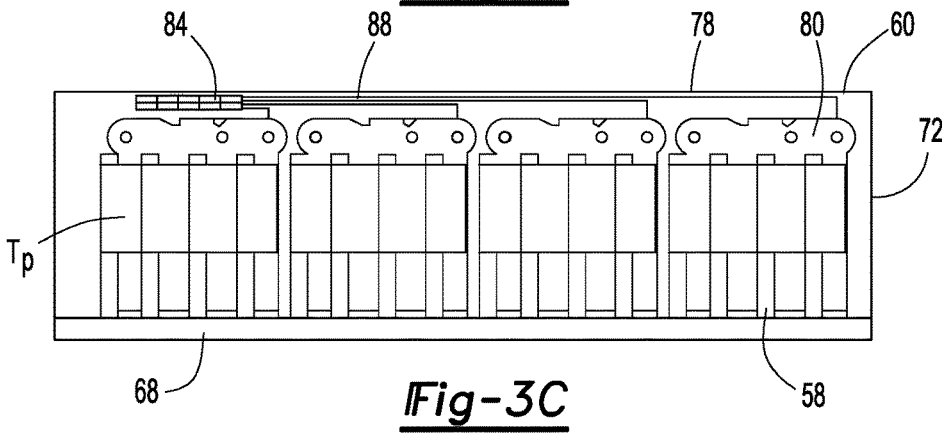
Figure 4B:
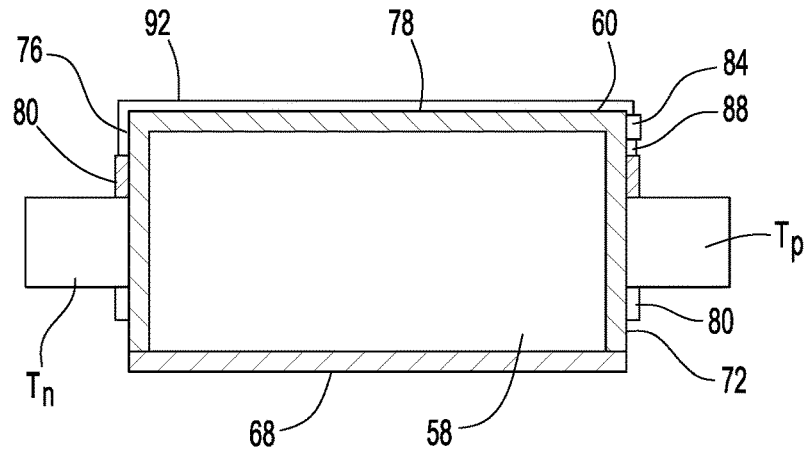
Figure 4C:
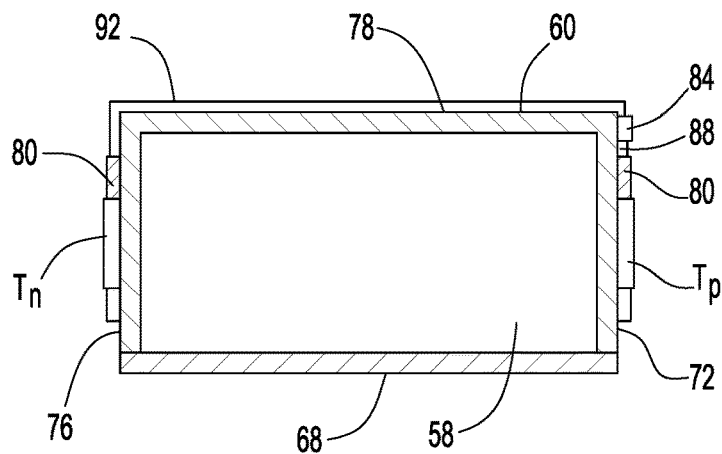

After positioning the interconnect assembly 60 over the battery cells 58 as shown in FIGS. 3B and 4B, the positive terminals $T_P$ and negative terminals $T_N$ are then bent to the position of FIGS. 3C and 4C. Bending the positive terminals $T_P$ and negative terminals $T_N$ over the busbars 80 electrically couples the positive terminals $T_P$ and negative terminals $T_N$ to the respective busbars 80.

Figure 5:
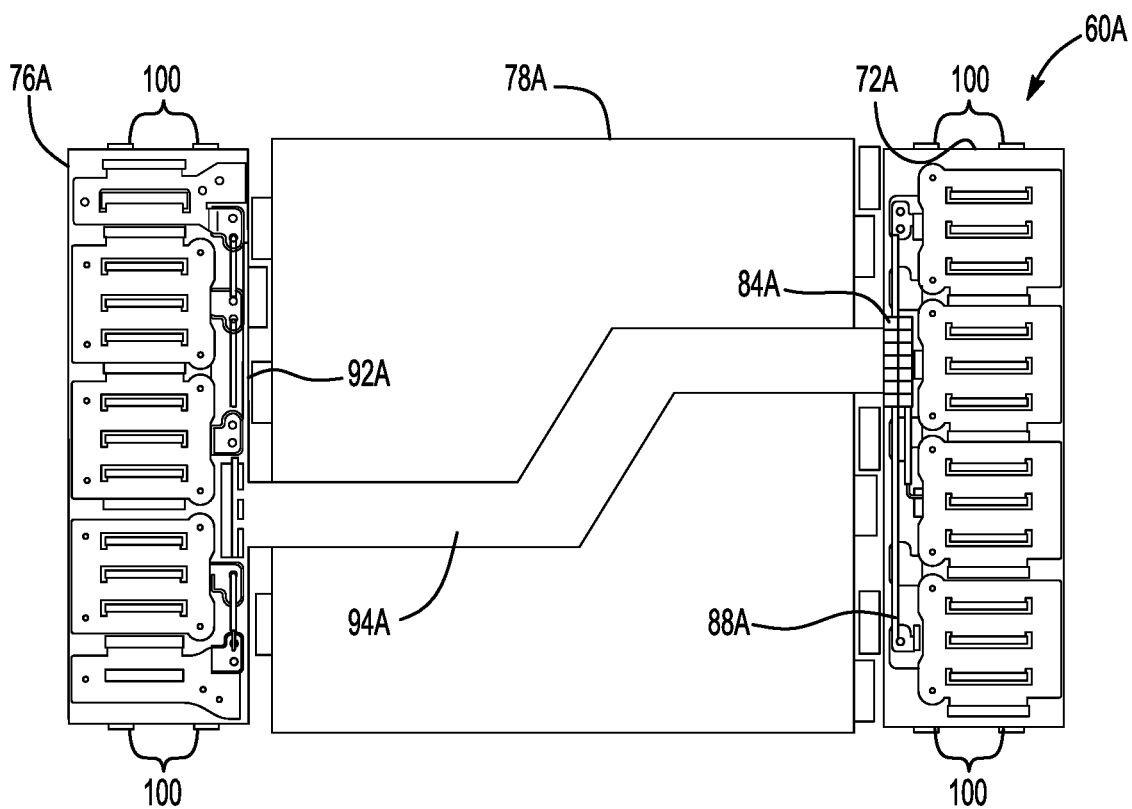
FIG. 5 illustrates a top view of an interconnect assembly according to another exemplary embodiment of the present disclosure.

Referring now to FIG. 5, another interconnect assembly 60A can include the first side 72A and the second side 76A hingedly connected to the base side 78A. The multi-port connector 84A is disposed on the first side 72A and operably connected to at least one first sense lead 88A on the first side 72A.

The crossover 94A extends across the base side 78A to operably connect at least one second sense lead 92A on the second side 76A to the multi-port connector 84A.

FIG. 5 shows the first side 72A and the second side 76A rotated to a position where the first side 72A, second side 76A, and the base side 78A are disposed along, generally, a common plane.

Figure 6A:
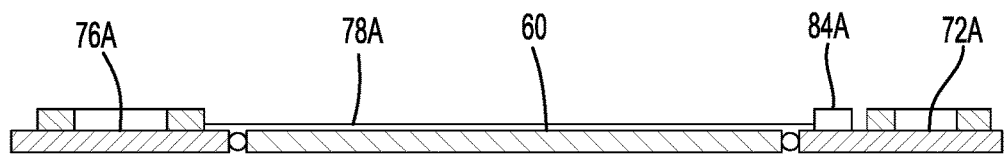
FIG. 6A-6C illustrate end views of assembly stages when securing the interconnect assembly of FIG. 5 to a battery array.
Figure 6A:
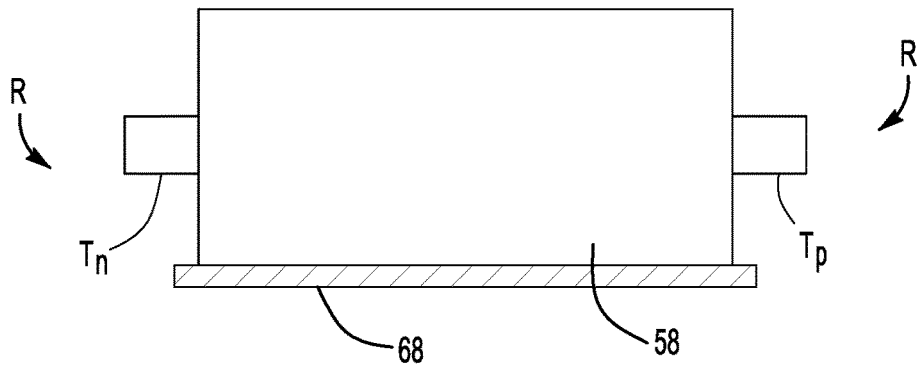

During assembly, the base side 78A can be placed adjacent the battery cells 58 as shown in FIG. 6A. The first side 72A and the second side 76A are then rotated in a direction R to the position of FIG. 6B. During rotation of the first side 72A, the positive terminals $T_N$ move into slots 98A on the first side 72A and the negative terminals $T_N$ move into slots 98A on the second side 76A. Unlike the slots 98 of the FIGS. 2-4C embodiment, the slots 98A do not have an open end.

Figure 6B:
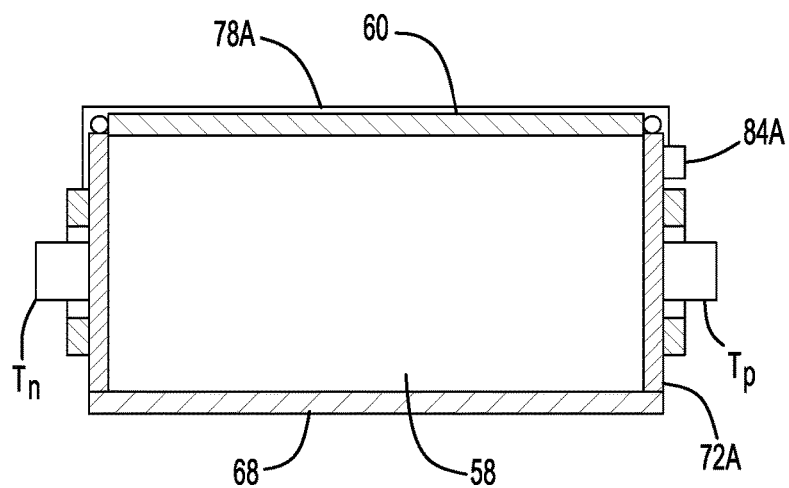

In this example, the first side 72A and the second side 76A can include snap features 100 (FIG. 5) that engage corresponding snap features of the endplates, for example, when the first side 72A and second side 76A are rotated to the position of FIG. 6B. Exemplary snap features 100 can include fingers that latch into a corresponding aperture, Christmas-tree type pins that are received within a corresponding aperture, arrow-head type extensions that are received within a corresponding aperture, wedges that are fit within an aperture, or some combination of these snap features.

Figure 6C:
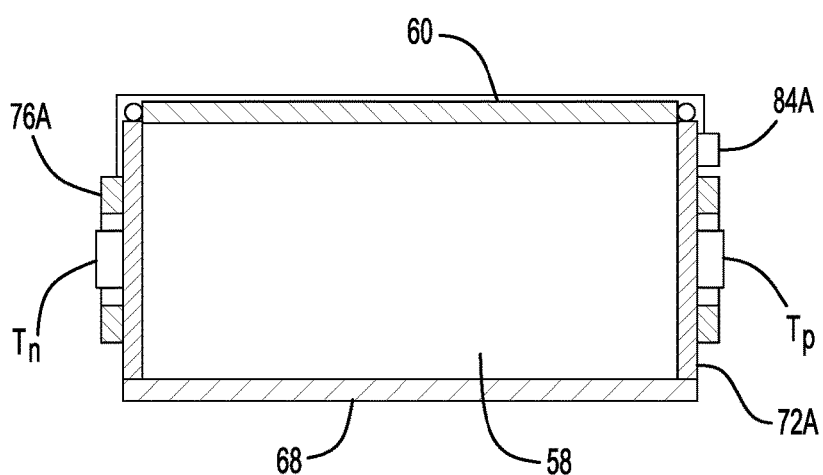

The positive terminals $T_P$ and the negative terminals $T_N$ are then folded over the busbars 80 on the first side 72A and the second side 76A to the position of FIG. 6C. This electrically couples the terminals $T_P$ and $T_N$ to respective busbars 80.

The multi-port connector 84A can then be engaged with a corresponding connector to communicate signals from sense leads 88A that communicate with a structure on the first side 72A and from sense leads 92A that communicate with a structure on the second side 76A.

In the exemplary embodiments, the sense leads communicate with structures on respective sides that are opposite one another. This disclosure, however, is not limited to sense leads communicating with structures on sides that are directly opposite one another.

Other examples could include sides that are transverse to one another. These sides are monitored by first and second sense leads respectively, and the first and second sense leads communicate with a single multi-port connector. For example, with reference to FIG. 5, the at least one second sense lead 92A could monitor a structure on the base side 78A while the at least one first sense lead continues to monitor the structure on the first side 72A.

Further, although the exemplary embodiments show the multi-port connectors 84, 84A on a side operably coupled to sense leads, the multi-port connectors 84, 84A could be mounted on other sides, such as the base sides 78, 78A.

Some features of the exemplary embodiments include an interconnect board with crossover, which facilitates the use of a single multi-port connector that can monitor both sides of an array of battery cells. The interconnect board can replace a portion of an enclosure for an array of battery cells, such as an enclosure cover.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. A battery interconnect assembly, comprising:
   at least one first sense lead operably coupled to a first structure on a first side;
   at least one second sense lead operably coupled to a second structure on a different, second side, wherein the first side faces in a first direction, and the second side faces in a different, second direction; and
   a multi-port connector configured to communicate signals from both the at least one first sense lead and the at least one second sense lead,
   wherein the first side is transverse to the second side.

2. The battery interconnect assembly of claim 1, wherein the first side is opposite the second side.

3. The battery interconnect assembly of claim 1, wherein the first structure on the first side is a busbar electrically coupled to at least one positive battery terminal, and the second structure on the second side is a busbar electrically coupled to at least one negative battery terminal.

4. The battery interconnect assembly of claim 1, further comprising a first and second flap each hinged to a base side, the first structure on the first side mounted to the first flap, the second structure on the second side mounted to the second flap.

5. The battery interconnect assembly of claim 4, wherein the first and second flap each include at least one snap feature configured to engage an endplate of a battery module.

6. The battery interconnect assembly of claim 4, wherein the base side provides a portion of an enclosure for battery cells.

7. The battery interconnect assembly of claim 1, further comprising an enclosure cover, the first structure on the first side mounted to a first side of the enclosure cover, the second structure on the second side mounted to an opposite, second side of the enclosure cover.

8. The battery interconnect assembly of claim 1, further comprising thermoplastic staking that secures the at least one first sense lead to the first side by thermoplastic staking.

9. The battery interconnect assembly of claim 8, wherein the thermoplastic staking additionally secures the first structure to the first side.

10. The battery interconnect assembly of claim 9, wherein the first structure is a busbar.

11. The battery interconnect assembly of claim 4, wherein the first structure on the first side is a busbar electrically coupled to at least one positive battery terminal, and the second structure on the second side is a busbar electrically coupled to at least one negative battery terminal.

12. The battery interconnect assembly of claim 1, wherein the multi-port connector is a pin connector.

13. A battery interconnect assembly, comprising:
   at least one first sense lead operably coupled to a first structure on a first side;
   at least one second sense lead operably coupled to a second structure on a different, second side, wherein the first side faces in a first direction, and the second side faces in a different, second direction; and
   a multi-port connector configured to communicate signals from both the at least one first sense lead and the at least one second sense lead,
   wherein the multi-port connector is disposed on the first side, and further comprising a sense lead crossover extending from the at least one second sense lead to the multi-port connector.

14. The battery interconnect assembly of claim 13, wherein the sense lead crossover is a flexible printed circuit.

15. A battery interconnect assembly, comprising:
   a plurality of battery cells disposed along an axis;
   at least one first sense lead operably coupled to a first busbar structure on a first side of the plurality of battery cells, the first side facing in a first direction, the first busbar structure coupled to a positive terminal of at least one of the plurality of battery cells;
   at least one second sense lead operably coupled to a second busbar structure on a different, second side of the plurality of battery cells, the second side facing in a second direction that is different that the first direction, the second busbar structure coupled to a negative terminal of at least one of the plurality of battery cells; and
   a multi-port connector configured to communicate signals from both the at least one first sense lead and the at least one second sense lead.

16. The battery interconnect assembly of claim 15, further comprising a sense lead crossover extending from the at least one second sense lead to the multi-port connector.

17. The battery interconnect assembly of claim 15, wherein the multi-port connector is a pin connector, wherein the signals are voltage signals.

18. The battery interconnect assembly of claim 15, further comprising a first and second flap each hinged to a base side, the first busbar structure on the first side mounted to the first flap, the second busbar structure on the second side mounted to the second flap.

* * * * *